US012727308B2

(12) United States Patent
Huang et al.

(10) Patent No.: US 12,727,308 B2
(45) Date of Patent: Sep. 1, 2026

(54) PIXEL STRUCTURE

(71) Applicant: AUO Corporation, Hsinchu (TW)

(72) Inventors: Chi-Chen Huang, Hsinchu (TW); Jien-Feng Huang, Hsinchu (TW); Chiu-Lan Hsu, Hsinchu (TW); Cheng Wei Lee, Hsinchu (TW); Yi Cheng Hsiao, Hsinchu (TW); I Cheng Hung, Hsinchu (TW); Wu Chang Tsai, Hsinchu (TW); Tzu-Chiang Cheng, Hsinchu (TW); Ya-Ke Yu, Hsinchu (TW); Ren-Mei Tseng, Hsinchu (TW)

(73) Assignee: AUO Corporation, Hsinchu (TW)

( * ) Notice: Subject to any disclaimer, the term of this patent is extended or adjusted under 35 U.S.C. 154(b) by 378 days.

(21) Appl. No.: 18/395,614

(22) Filed: Dec. 24, 2023

(65) Prior Publication Data

US 2025/0169252 A1 May 22, 2025

(30) Foreign Application Priority Data

Nov. 22, 2023 (TW) ................................ 112145218

(51) Int. Cl.
*H10H 20/857* (2025.01)
*H10H 20/831* (2025.01)
(Continued)

(52) U.S. Cl.
CPC ........ *H10H 20/857* (2025.01); *H10H 20/831* (2025.01); *H10H 29/39* (2025.01);
(Continued)

(58) Field of Classification Search
CPC ......... H10H 20/83–831; H10H 20/857; H10H 29/39; H10H 29/49
See application file for complete search history.

(56) References Cited

U.S. PATENT DOCUMENTS

2021/0296537 A1* 9/2021 Lee .................... H10H 20/8312
2022/0384555 A1 12/2022 Ma et al.
(Continued)

FOREIGN PATENT DOCUMENTS

CN 110391252 10/2019
CN 115985930 4/2023
(Continued)

*Primary Examiner* — Christine S. Kim
*Assistant Examiner* — Tyler J Wiegand
(74) *Attorney, Agent, or Firm* — JCIPRNET

(57) ABSTRACT

A pixel structure includes a pixel driving circuit, a first insulating layer, a first conductive pattern, a second insulating layer, a second conductive pattern, multiple bonding pads and a light-emitting element. The first conductive pattern is disposed on the first insulating layer and is electrically connected to the pixel driving circuit through a first contact window of the first insulation layer. The second conductive pattern is disposed on the second insulating layer and is electrically connected to the first conductive pattern through a second contact window of the second insulation layer. In a top view of the pixel structure, the first contact window and the second contact window have a first spacing in a first direction, and the first contact window and the second contact window have a second spacing in a second direction.

5 Claims, 6 Drawing Sheets

(51) Int. Cl.
*H10H 29/39* (2025.01)
*H10H 29/41* (2025.01)
*H10H 29/49* (2025.01)
*H10W 90/00* (2026.01)

(52) U.S. Cl.
CPC ............ *H10H 29/41* (2025.01); *H10H 29/49* (2025.01); *H10W 90/00* (2026.01)

(56) References Cited

U.S. PATENT DOCUMENTS

| | | | | |
|---|---|---|---|---|
| 2023/0238372 | A1* | 7/2023 | Lee | H10W 90/00 |
| 2024/0186472 | A1* | 6/2024 | Yoon | H10D 86/00 |
| 2025/0054923 | A1* | 2/2025 | Kim | H10D 86/00 |
| 2025/0143045 | A1* | 5/2025 | Choi | H10H 20/857 |
| 2026/0006957 | A1* | 1/2026 | Meng | H10H 20/857 |

FOREIGN PATENT DOCUMENTS

| | | |
|---|---|---|
| JP | 2019051586 | 4/2019 |
| WO | 2021081765 | 5/2021 |

* cited by examiner

PIXEL STRUCTURE

CROSS-REFERENCE TO RELATED APPLICATION

This application claims the priority benefit of Taiwan application serial no. 112145218, filed on Nov. 22, 2023. The entirety of the above-mentioned patent application is hereby incorporated by reference herein and made a part of this specification.

BACKGROUND

Technical Field

The disclosure relates to a pixel structure.

Description of Related Art

A light-emitting diode (LED) display panel includes a driving backplate and multiple LED elements disposed on the driving backplate. Inheriting the characteristic of LED, the LED display panel has advantages such as power saving, high efficiency, high brightness and fast response time. Moreover, the LED display panel also has advantages such as easy color adjustment, longer working life, and no image retention compared with an organic LED display panel. Therefore, the LED display panel is regarded as the display technology of next generation.

In general, during the manufacturing process of LED display panel, the LED elements need to be massively transferred to the driving backplate, and a technique of laser bonding is utilized to join the LED elements with a bonding pad of the driving backplate. However, after utilizing the technique of laser bonding to join the LED elements with the bonding pad, a peeling appears in the contact window of certain feature locations of the driving backplate, which results in a declining yield of the LED display panel.

SUMMARY

The disclosure provides a pixel structure wherein peeling rarely happens.

The pixel structure according to the disclosure includes a pixel driving circuit, a first insulating layer, a first conductive pattern, a second insulating layer, a second conductive pattern, multiple bonding pads and light-emitting elements. The first insulating layer is disposed on the pixel driving circuit and has a first contact window. The first contact window overlaps the pixel driving circuit. The first conductive pattern is disposed on the first insulating layer and is electrically connected to the pixel driving circuit through the first contact window. The second insulating layer is disposed on the first insulating layer and the first conductive pattern. The second insulating layer has a second contact window, and the second contact window overlaps the first conductive pattern. The second conductive pattern is disposed on the second insulating layer and is electrically connected to the first conductive pattern through the second contact window. Multiple bonding pads are disposed on the second insulating layer, wherein one of the bonding pads is connected to the second conductive pattern. The light-emitting elements are electrically connected to multiple bonding pads. In a top view of the pixel structure, wherein multiple bonding pads are arranged in a first direction, the second direction is perpendicular to the first direction, the first contact window and the second contact window have a first spacing in the first direction, and the first contact window and the second contact window have a second spacing in a second direction.

DESCRIPTION OF THE EMBODIMENTS

Figure 1:
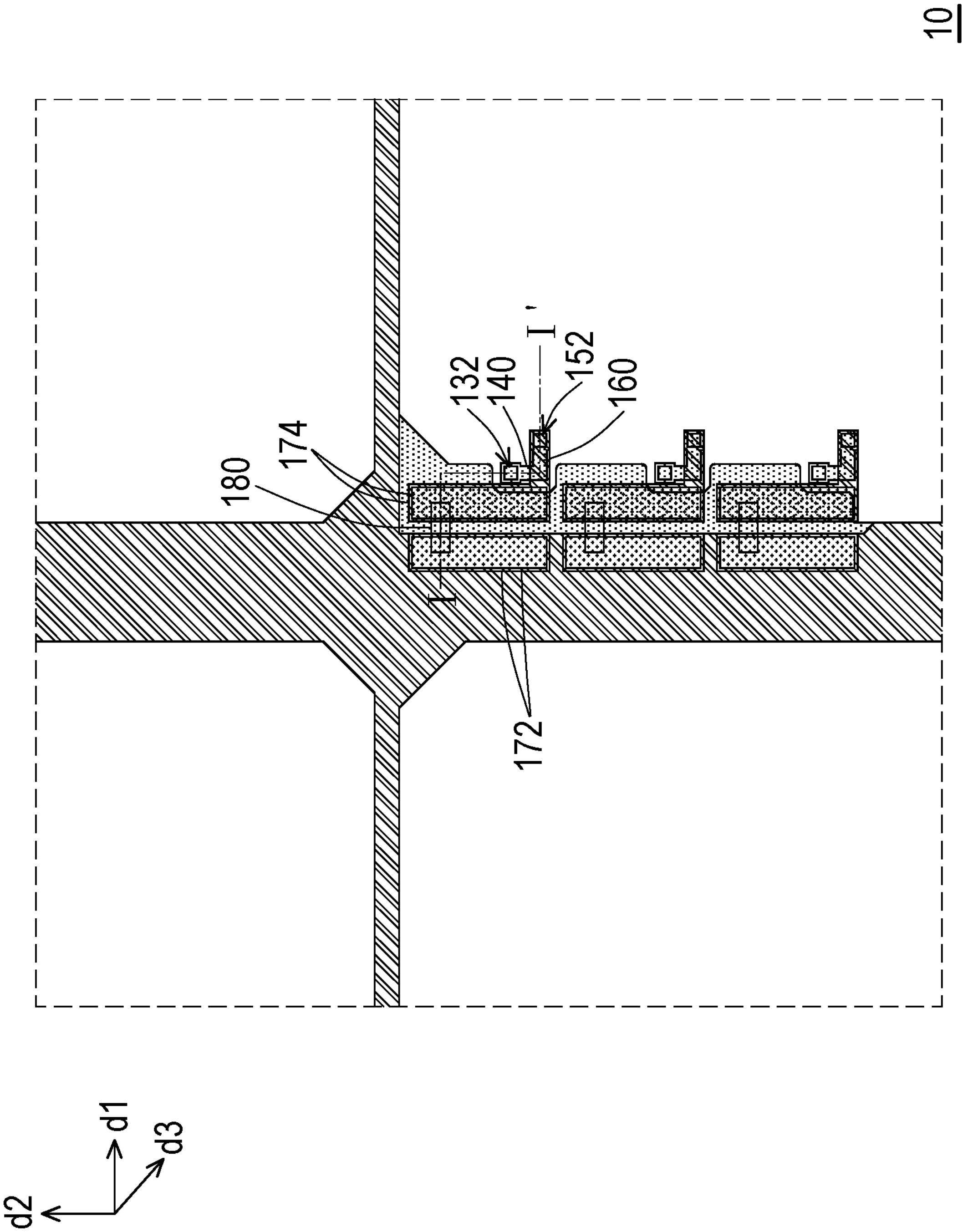
FIG. 1 is a top view of a pixel structure according to an embodiment of the disclosure.

Reference will now be made in detail to the exemplary embodiments of the disclosure, and examples of the exemplary embodiments are illustrated in the accompanying drawing. Whenever possible, the same element symbols are used in the drawings and descriptions to indicate the same or similar parts.

It should be understood that when an element such as a layer, film, region or substrate is referred to as being "on" or "connected to" another element, it may be directly on or connected directly to another element, or the intermediate element may also be present. In contrast, when an element is referred to as being "directly on" or "directly connected to" another element, there are no intervening elements. As used herein, "connected" may refer to physical and/or electrical connection. Furthermore, "electrically connected" or "coupled" may mean that there are other elements between two elements.

As used herein, "about," "approximately," or "substantially" includes the stated value and an average value within an acceptable deviation range of a particular value determined by one of ordinary skill in the art, taking into account the measurement in question and the specific number of measurement-related errors (i.e., limitations of the measurement system). For example, "about" may mean within one or more standard deviations of the stated value, or within ±30%, ±20%, ±10%, ±5%. Furthermore, the "about", "approximately" or "substantially" used herein may be based on optical properties, etching properties or other properties to select a more acceptable range of deviation or standard deviation, instead of one standard deviation for all properties.

Unless otherwise defined, all terms (including technical and scientific terms) used herein have the same meaning as commonly understood by those of ordinary skill in the art to which the disclosure belongs. It will be further understood that terms such as those defined in commonly used dictionaries should be interpreted as having meanings consistent with their meanings in the context of related technologies and the disclosure, and will not be interpreted as idealized or excessive formal meaning, unless explicitly defined as such herein.

Figure 2:
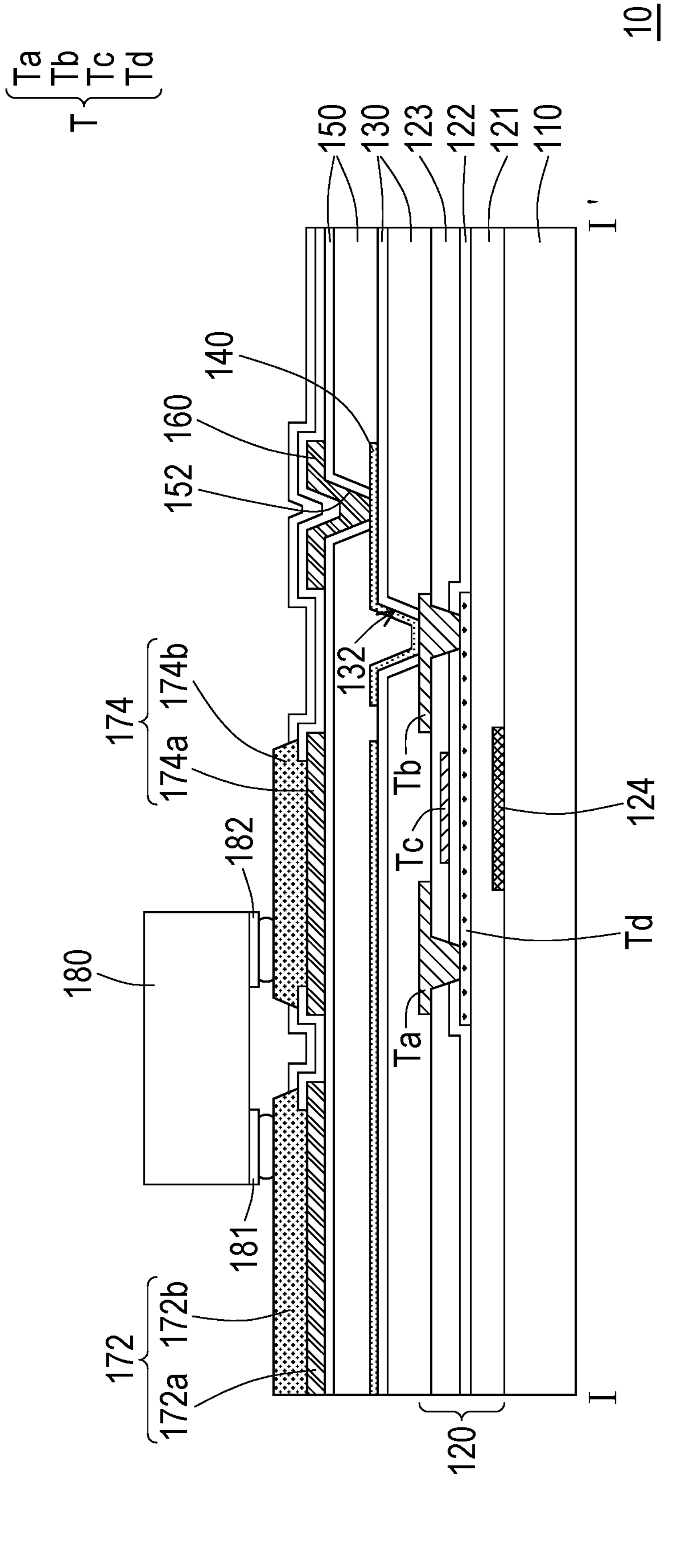
FIG. 2 is a cross-sectional view of a pixel structure according to an embodiment of the disclosure.
Figure 3:
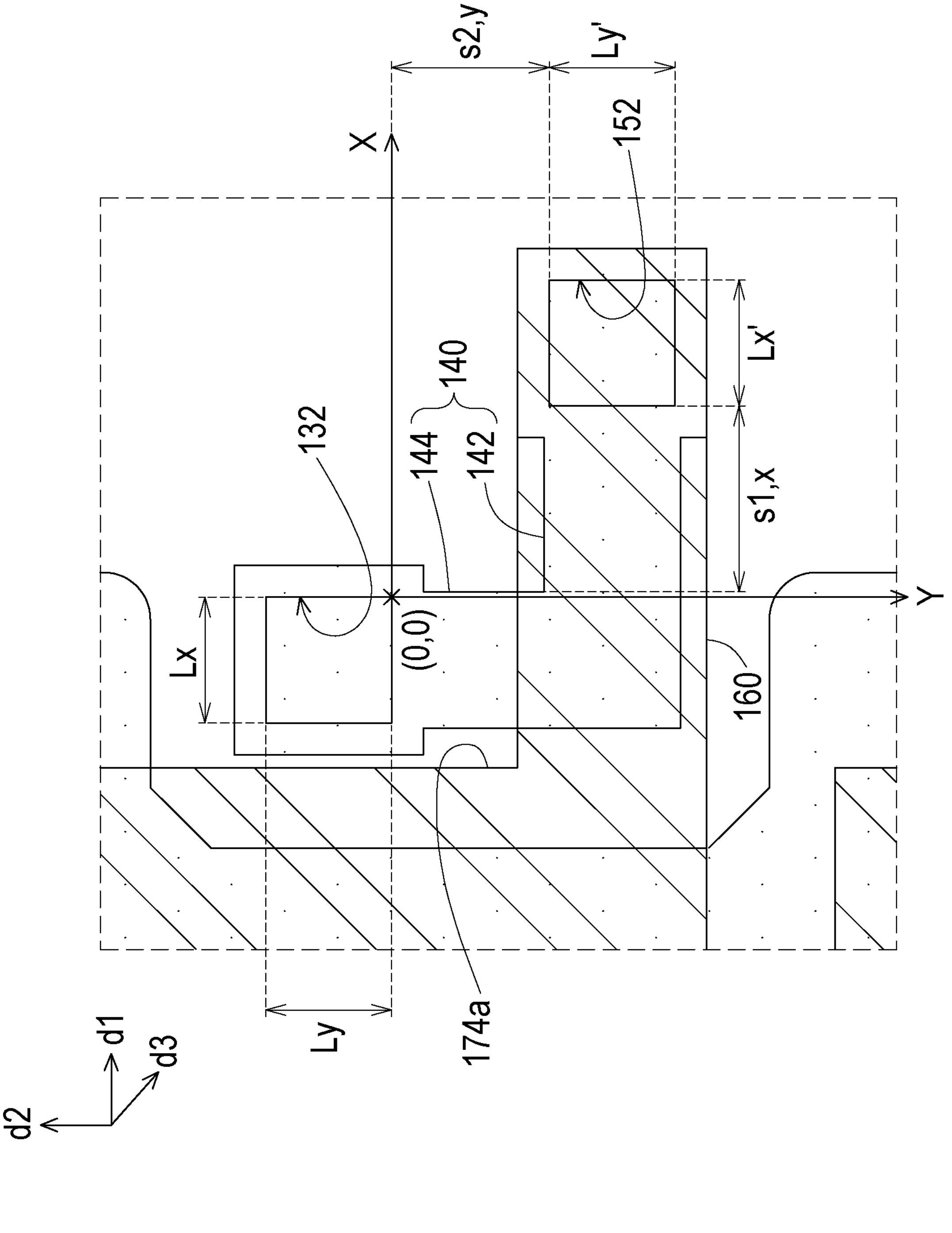
FIG. 3 is an enlarged top view of a partial pixel structure according to an embodiment of the disclosure.

FIG. 1 is a top view of a pixel structure according to an embodiment of the disclosure. FIG. 2 is a cross-sectional view of a pixel structure according to an embodiment of the disclosure. FIG. 2 corresponds to the section line I-I' of FIG. 1. FIG. 3 is an enlarged top view of a partial pixel structure according to an embodiment of the disclosure.

Please refer to FIG. 1 and FIG. 2. A pixel structure 10 includes a pixel driving circuit 120 disposed on a substrate 110. For example, in an embodiment, the pixel driving circuit 120 may include a first transistor (not shown), a second transistor T and a capacitor (not shown), the first terminal of the first transistor is electrically connected to a corresponding data line (not shown), the control terminal of the first transistor is electrically connected to a corresponding scan line (not shown), the second terminal of the first transistor is electrically connected to the control terminal Tc of the second transistor T, the first terminal Ta of the second transistor T is electrically connected to a corresponding power line (not shown), and the capacitor is electrically connected to the second terminal of the first transistor and the first terminal Ta of the second transistor T. However, the disclosure is not limited thereto. In other embodiment, the pixel driving circuit 120 may be a circuit in other form.

In an embodiment, a semiconductor design Td of the second transistor T may be optionally disposed on a buffer layer 121, a gate insulating layer 122 may be disposed on the semiconductor design Td, the control terminal Tc of the second transistor T may be disposed on the gate insulating layer 122, an interlayer dielectric layer 123 may be disposed on the control terminal Tc of the second transistor T and the gate insulating layer 122, the first terminal Ta and the second terminal Tb of the second transistor T may be disposed on the interlayer dielectric layer 123 and electrically connected to two different regions respectively of the semiconductor design Td. In short, in an embodiment, the second transistor T may be optionally a top gate thin film transistor (top gate TFT), and a masking pattern 124 may be optionally disposed between the substrate 110 and the semiconductor design Td of the second transistor T. However, the disclosure is not limited thereto. In other embodiment, the second transistor T may also be a bottom gate thin film transistor (bottom gate TFT) or a transistor in other form.

The pixel structure 10 further includes a first insulating layer 130 disposed on the driving circuit 120, and has a first contact window 132, wherein the first contact window 132 overlaps the pixel driving circuit 120. Specifically, in an embodiment, the first contact window 132 may overlap the second terminal Tb of the second transistor T. The first insulating layer 130 may be stacked by single film layer or multiple film layers. In an embodiment, the materials of the first insulating layer 130 may be inorganic materials (such as silicon oxide, silicon nitride, silicon oxynitride, or a stacked layer of at least two of the foregoing), organic materials or combinations of the foregoing.

The pixel structure 10 further includes a first conductive pattern 140 disposed on the first insulating layer 130 and is electrically connected to the pixel driving circuit 120 through the first contact window 132. Based on the consideration of conductivity, the first conductive pattern 140 is generally made of metal materials. However, the disclosure is not limited thereto. In other embodiment, the first conductive pattern 140 may use other conductive materials, such as alloys, nitrides of metallic materials, oxides of metallic materials, oxynitrides of metallic materials, or a stacked layer of metallic materials and other conductive materials.

The pixel structure 10 further includes a second insulating layer 150 disposed on the first insulating layer 130 and the first conductive pattern 140, wherein the second insulating layer 150 has a second contact window 152, and the second contact window 152 overlaps the first conductive pattern 140. The second insulating layer 150 may be stacked by single film layer or multiple film layers. In an embodiment, the materials of the second insulating layer 150 may be inorganic materials (such as silicon oxide, silicon nitride, silicon oxynitride, or a stacked layer of at least two of the foregoing), organic materials or combinations of the foregoing.

Please refer to FIG. 1, FIG. 2 and FIG. 3. The pixel structure 10 further includes a second conductive pattern 160 disposed on the second insulating layer 150 and is electrically connected to the first conductive pattern 140 through the second contact window 152. In an embodiment, the first conductive pattern 140 has a first part 142 (marked in FIG. 3) connected with a second part 144 (marked in FIG. 3), the first part 142 overlaps the second contact window 152 and extends in the first direction d1, the second part 144 overlaps the first contact window 132 and extends in the second direction d2. In an embodiment, the second conductive pattern 160 overlaps the first part 142 of the first conductive pattern 140, and does not overlap the second part 144 of the first conductive pattern 140.

Based on the consideration of conductivity, the second conductive pattern 160 is generally made of metal materials. However, the disclosure is not limited thereto. In other embodiments, the second conductive pattern 160 may use other conductive materials, such as alloys, nitrides of metallic materials, oxides of metallic materials, oxynitrides of metallic materials, or a stacked layer of metallic materials and other conductive materials.

Please refer to FIG. 1, FIG. 2 and FIG. 3. The pixel structure 10 further includes multiple bonding pads 172 and 174 disposed on the second insulating layer 150, wherein a bonding pad 174 is connected to the second conductive pattern 160. For example, in an embodiment, each bonding pad 172/174 may include a bottom layer 172*a*/174*a* and a bonding layer 172*b*/174*b* disposed on the bottom layer 172*a*/174*a* and electrically connected to the bottom layer 172*a*/174*a*, the bottom layer 174*a* of the bonding pad 174 may directly connect to the second conductive pattern 160 disposed outside the bonding pad 174, but the disclosure is not limited thereto. In an embodiment, the bonding pad 174 is electrically connected to the second terminal Tb of the second transistor T of the pixel driving circuit 120 through the second conductive pattern 160 and the first conductive pattern 140, another bonding pad 172 is electrically connected to a common line (not shown), but the disclosure is not limited thereto.

The pixel structure 10 further includes a light-emitting element 180 electrically connected to multiple bonding pads 172 and 174. Specifically, in an embodiment, the light-emitting element 180 includes a first type semiconductor layer (not shown), a second type semiconductor layer (not shown), an active layer disposed between the first type semiconductor layer and the second type semiconductor layer (not shown), a first electrode 182 electrically connected to the first type semiconductor layer and a second electrode 184 electrically connected to the second type semiconductor layer, wherein the first electrode 182 and the second electrode 184 are electrically connected to multiple bonding pads 172 and 174 respectively. In an embodiment, the light-emitting element 180 is a micro light-emitting diode (LED), but the disclosure is not limited thereto.

Please refer to FIG. 1 and FIG. 3. Note that in a top view of the pixel structure 10, multiple bonding pads 172 and 174 are arranged in the first direction d1, the second direction d2 is perpendicular to the first direction d1, the first contact window 132 and the second contact window 152 have the first spacing s1 in the first direction d1, and the first contact window 132 and the second contact window 152 have the second spacing s2 in the second direction d2. In a top view of the pixel structure 10, the first contact window 132 and the second contact window 152 are arranged in the third direction d3, and the third direction d3 interlaces with the first direction d1 and the second direction d2. That is to say, the first contact window 132 and the second contact window 152 are disposed along a diagonal line (not shown). In this manner, when utilizing the technique of laser bonding to join the light-emitting element 180 with bonding pad 172 and 174, the issue of a peeling resulted from overstress at the location of second contact window 152 and neighboring region thereof due to an increase in temperature may be avoided.

In an embodiment, the first contact window 132 has the first width Lx in the first direction d1, the width of the first spacing s1 in the first direction d1 is x, and $x \geq 0.2 \times Lx$. In an embodiment, the second contact window 152 has the first width Lx' in the first direction d1, the width of the first spacing s1 in the first direction d1 is x, and $x \geq 0.2 \times Lx'$. In an embodiment, the first contact window 132 has the second width Ly in the second direction d2, the width of the second spacing s2 in the second direction d2 is y, and $y \geq 0.2 \times Ly$. In an embodiment, the second contact window 152 has the second width Ly' in the second direction d2, the width of the second spacing s2 in the second direction d2 is y, and $y \geq 0.2 \times Ly$.

Figure 4:
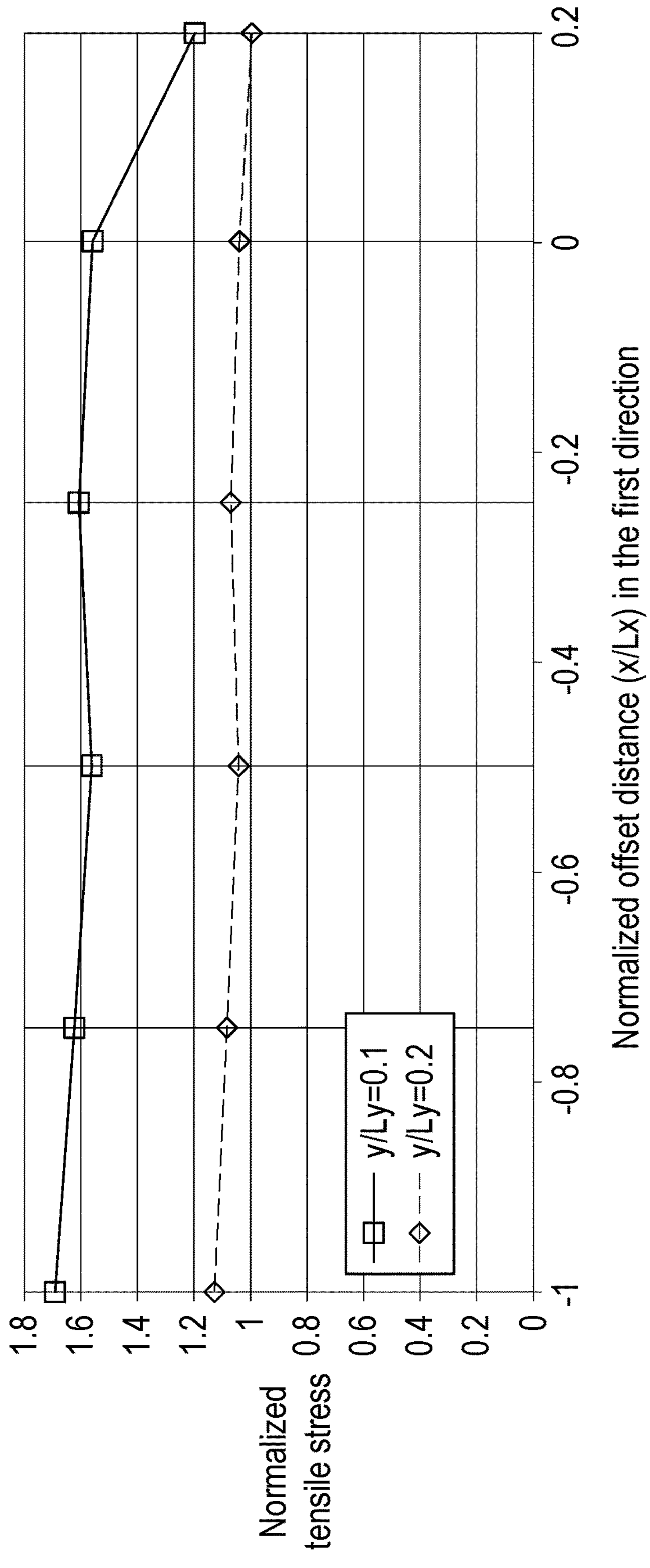
FIG. 4 illustrates the relationship between the normalized offset distance x/Lx in the first direction d1 at the location of the second contact window and normalized tensile stress when the normalized offset distance y/Ly in the second direction is 0.1 and 0.2 respectively.
Figure 5:
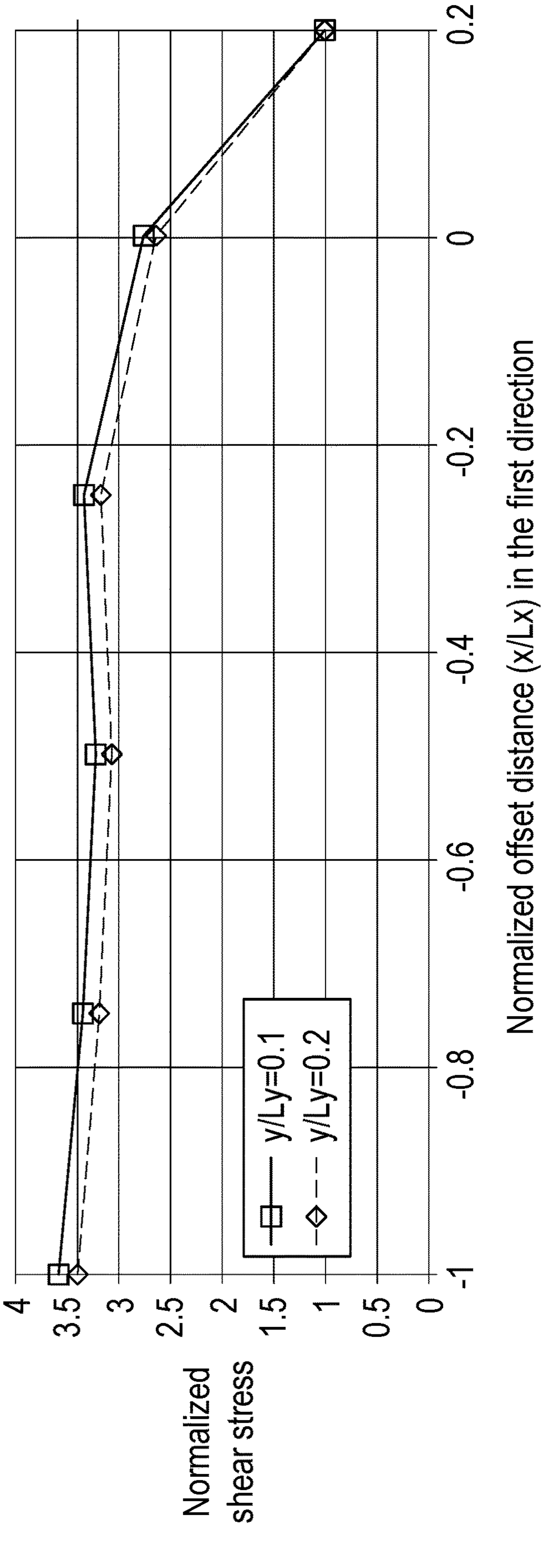
FIG. 5 illustrates the relationship between the normalized offset distance x/Lx in the first direction at the location of the second contact window 152 and normalized shear stress when the normalized offset distance y/Ly in the second direction is 0.1 and 0.2 respectively.

The normalized offset distance in the first direction is $d1 = x/Lx$; the normalized offset distance in the second direction is $d2 = y/Ly$. FIG. 4 illustrates the relationship between the normalized offset distance x/Lx in the first direction d1 at the location of the second contact window 152 and normalized tensile stress when the normalized offset distance y/Ly in the second direction d2 is 0.1 and 0.2 respectively. FIG. 5 illustrates the relationship between the normalized offset distance x/Lx in the first direction d1 at the location of the second contact window 152 and normalized shear stress when the normalized offset distance y/Ly in the second direction d2 is 0.1 and 0.2 respectively. In FIG. 3, an XY coordinate system is drawn, with its origin (0, 0) located at one corner of the first contact window 132. Referring to FIGS. 3. 4, and 5, when the x-coordinate of the second contact window 152 in this XY coordinate system is positive (i.e., the second contact window 152 is positioned to the right of the first contact window 132), the offset distance x at the location of the second contact window 152 is positive. When the x-coordinate of the second contact window 152 is negative (i.e., the second contact window 152 is positioned to the left of the first contact window 132), the offset distance x at the location of the second contact window 152 is negative. When the y-coordinate of the second contact window 152 is positive (i.e., the second contact window 152 is positioned below the first contact window 132), the offset distance y at the location of the second contact window 152 is positive. When the y-coordinate of the second contact window 152 is negative (i.e., the second contact window 152 is positioned above the first contact window 132), the offset distance y at the location of the second contact window 152 is negative. The first width Lx is always a positive value. Referring to FIG. 4 and FIG. 5, when the normalized offset distance x/Lx in the first direction d1 increases to 0.2, the normalized tensile stress and the normalized shear stress both significantly descend. It can be proved that $x \geq 0.2 \times Lx$ (i.e., $x/Lx \geq 0.2$) may render a tensile stress and a shear stress significantly descend. Similarly, $y \geq 0.2 \times Ly$ (i.e., $y/Ly \geq 0.2$) may render the tensile stress and the shear stress significantly descend.

Please refer to FIG. 1 and FIG. 3. In the top view of the pixel structure 10 of an embodiment, the first conductive pattern 140 has an area laid between the first contact window 132 and the second contact window 152, the area of the first conductive pattern 140 is smaller than or equal to ten times the area of the first contact window 132. That is to say, the partial area of the first conductive pattern 140 disposed between the first contact window 132 and the second contact window 152 is small, and does not overly affect the aperture ratio of the display panel utilizing the pixel structure 10.

Figure 6:
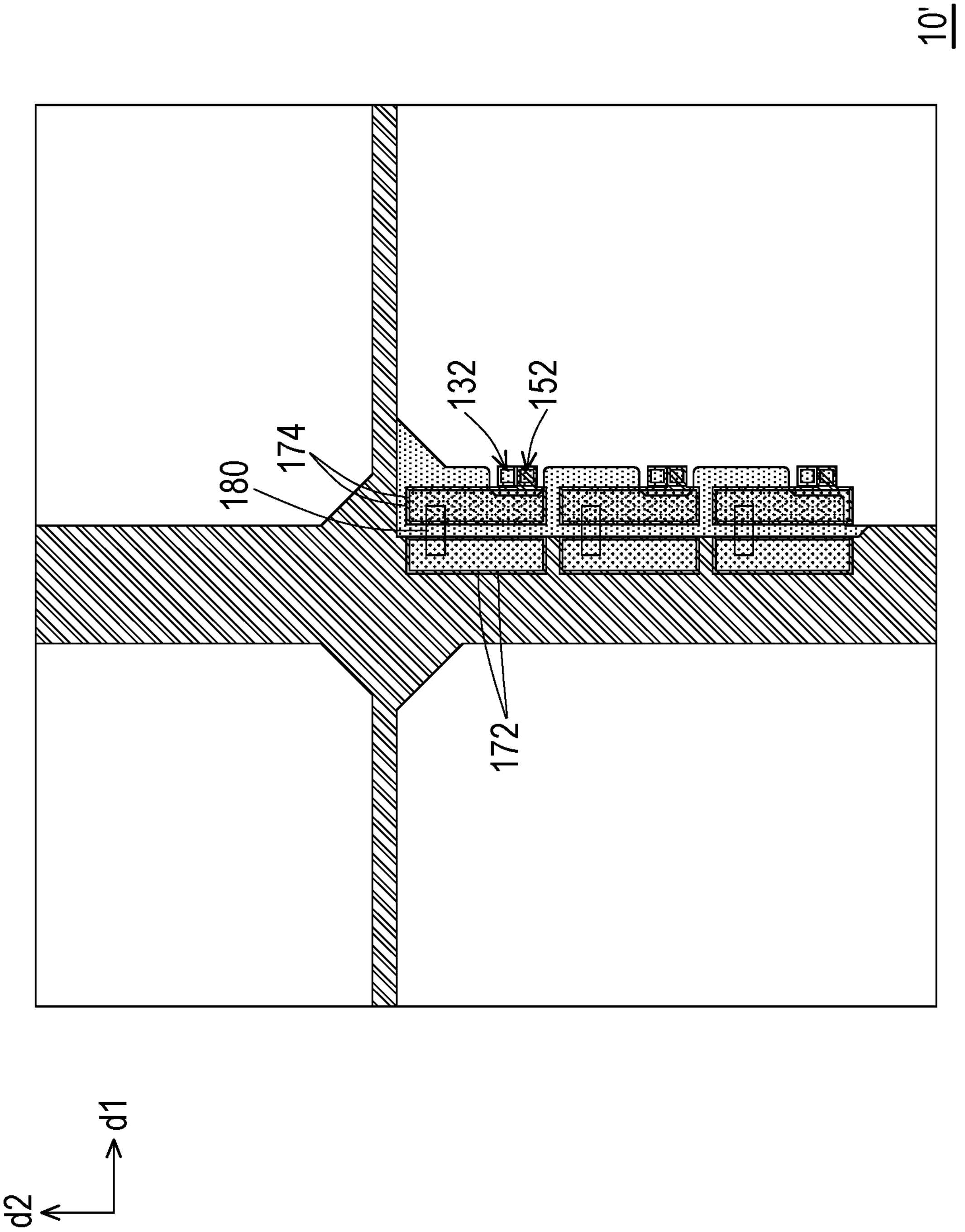
FIG. 6 is a top view of a pixel structure according to a comparison.

FIG. 6 is a top view of a pixel structure according to a comparison. A pixel structure 10' of the comparison according to FIG. 6 is similar to the pixel structure 10 of the embodiment according to FIG. 1, the difference between the two is: in the embodiment according to FIG. 6, the first contact window 132 and the second contact window 152 are disposed on a straight line parallel to the second direction d2 instead of disposed on a diagonal line parallel to the third direction d3. Compared to the pixel structure 10' of the comparison according to FIG. 6, the tensile stress in the pixel structure 10 of the embodiment according to FIG. 1 descends 35% on the second contact window 152, the shear stress in the pixel structure 10 of the embodiment according to FIG. 1 descends 52% on the second contact window 152.

What is claimed is:

1. A pixel structure, comprising:
- a pixel driving circuit;
- a first insulating layer disposed on the pixel driving circuit and having a first contact window, wherein the first contact window overlaps the pixel driving circuit;
- a first conductive pattern disposed on the first insulating layer and electrically connected to the pixel driving circuit through the first contact window;
- a second insulating layer disposed on the first insulating layer and the first conductive pattern, wherein the second insulating layer has a second contact window, and the second contact window overlaps the first conductive pattern;
- a second conductive pattern disposed on the second insulating layer and electrically connected to the first conductive pattern through the second contact window;
- a plurality of bonding pads disposed on the second insulating layer, wherein one of the bonding pads is connected to the second conductive pattern; and
- a light-emitting element electrically connected to the plurality of bonding pads;
- wherein in a top view of the pixel structure, the plurality of bonding pads are arranged in a first direction, a second direction is perpendicular to the first direction, the first contact window and the second contact window have a first spacing in the first direction, and the first contact window and the second contact window have a second spacing in the second direction;
- wherein the first contact window has a first width Lx in the first direction, and a width of the first spacing in the first direction is x, and $x = 0.2 \times Lx$;
- wherein the first contact window has a second width Ly in the second direction, and a width of the second spacing in the second direction is y, and $y = 0.2 \times Ly$.

2. The pixel structure according to claim 1, wherein in the top view of the pixel structure, the first contact window and the second contact window are arranged in a third direction, and the third direction interlaces with the first direction and the second direction.

3. The pixel structure according to claim 1, wherein in the top view of the pixel structure, the first conductive pattern has a first area laid between the first contact window and the second contact window, the first area of the first conductive pattern is smaller than or equal to ten times an area of the first contact window.

4. The pixel structure according to claim 1, wherein the first conductive pattern has a first part connected with a second part, the first part overlaps the second contact window and extends in the first direction, the second part overlaps the first contact window and extends in the second direction.

5. The pixel structure according to claim 4, wherein the second conductive pattern overlaps the first part of the first conductive pattern, and does not overlap the second part of the first conductive pattern.

* * * * *